United States Patent
Melamed et al.

(10) Patent No.: US 9,847,035 B1
(45) Date of Patent: Dec. 19, 2017

(54) METHODS FOR RADIO FREQUENCY SPECTRAL ANALYSIS

(71) Applicants: Howard Melamed, Coral Springs, FL (US); Stevan Melamed, Boca Raton, FL (US); Chris Svanberg, Coral Springs, FL (US); Matias Ponce, Coral Springs, FL (US); Michael Horvat, Pompano Beach, FL (US)

(72) Inventors: Howard Melamed, Coral Springs, FL (US); Stevan Melamed, Boca Raton, FL (US); Chris Svanberg, Coral Springs, FL (US); Matias Ponce, Coral Springs, FL (US); Michael Horvat, Pompano Beach, FL (US)

( * ) Notice: Subject to any disclaimer, the term of this patent is extended or adjusted under 35 U.S.C. 154(b) by 140 days.

(21) Appl. No.: 14/693,065

(22) Filed: Apr. 22, 2015

Related U.S. Application Data

(60) Provisional application No. 62/108,590, filed on Jan. 28, 2015.

(51) Int. Cl.
| | |
|---|---|
| *G08G 5/00* | (2006.01) |
| *G08G 5/02* | (2006.01) |
| *H04B 17/391* | (2015.01) |

(52) U.S. Cl.
CPC ......... *G08G 5/0073* (2013.01); *G08G 5/0008* (2013.01); *G08G 5/0069* (2013.01); *G08G 5/025* (2013.01); *H04B 17/391* (2015.01)

(58) Field of Classification Search
CPC .. G08G 5/0073; G08G 5/0008; G08G 5/0069; G08G 5/025; H04B 17/391
See application file for complete search history.

(56) References Cited

U.S. PATENT DOCUMENTS

| | | | |
|---|---|---|---|
| 4,468,656 | A | 8/1984 | Clifford |
| 4,723,311 | A | 2/1988 | Moustakas et al. |
| 4,727,537 | A | 2/1988 | Nichols |
| 4,825,435 | A | 4/1989 | Amundsen et al. |
| 4,990,814 | A | 2/1991 | Tanski et al. |
| 5,442,168 | A | 8/1995 | Gurner et al. |
| 5,568,476 | A | 10/1996 | Sherer et al. |
| 5,884,040 | A | 3/1999 | Chung |
| 5,930,696 | A | 7/1999 | Tzuang et al. |
| 5,966,646 | A | 10/1999 | Lampe et al. |
| 6,868,314 | B1 * | 3/2005 | Frink ................ B64C 1/00 244/119 |
| 7,236,766 | B2 | 6/2007 | Freeburg |
| 7,283,840 | B2 | 10/2007 | Cho |
| 7,336,939 | B2 | 2/2008 | Gomez |

(Continued)

FOREIGN PATENT DOCUMENTS

CN 103499808 A 1/2014

*Primary Examiner* — Marthe Marc-Coleman
(74) *Attorney, Agent, or Firm* — Malloy & Malloy, P.L.

(57) ABSTRACT

The invention is directed to methods for radio frequency spectral analysis. Accordingly, flight instructions are executed on a first UAV to fly in a first flight pattern relative to a signal source. The first UAV detects radio signal(s) from the signal source and associated signal data. Flight instructions are concurrently executed on a second UAV to fly in a second flight pattern, relative to the first flight pattern of the first UAV. The second UAV also detects radio signal(s) from the signal source and associated signal data. The stored signal data from the drones may then be processed for visualization.

20 Claims, 12 Drawing Sheets

(56) References Cited

U.S. PATENT DOCUMENTS

| | | |
|---|---|---|
| 7,339,981 B2 | 3/2008 | Dogan |
| 7,593,706 B2 | 9/2009 | Bucknor et al. |
| 7,668,505 B2 | 2/2010 | Vacanti et al. |
| 7,683,782 B2 | 3/2010 | Christopher |
| 7,853,261 B1 | 12/2010 | Lewis et al. |
| 8,164,440 B2 | 4/2012 | Lontka |
| 8,204,494 B2 | 6/2012 | Weinzierl |
| 8,305,196 B2 | 11/2012 | Kennedy et al. |
| 8,483,703 B2 | 7/2013 | Swope et al. |
| 8,543,053 B1 | 9/2013 | Melamed et al. |
| 8,655,348 B2 * | 2/2014 | Zha ............ H04W 24/08 455/421 |
| 8,750,903 B1 | 6/2014 | Fitzsimmons et al. |
| 8,761,687 B2 | 6/2014 | Chang et al. |
| 8,798,922 B2 | 8/2014 | Tillotson |
| 8,824,966 B2 | 9/2014 | Boes |
| 8,903,304 B2 | 12/2014 | Coleman |
| 8,955,110 B1 | 2/2015 | Twitchell |
| 9,048,944 B2 | 6/2015 | Boes |
| 9,204,488 B2 | 12/2015 | Bai |
| 9,246,629 B2 | 1/2016 | Coleman |
| 9,529,360 B1 | 12/2016 | Melamed et al. |
| 2001/0033600 A1 | 10/2001 | Yang et al. |
| 2003/0174763 A1 | 9/2003 | Kouki |
| 2004/0057537 A1 * | 3/2004 | Kim ............ H03D 7/163 375/346 |
| 2004/0130488 A1 | 7/2004 | De Champlain |
| 2004/0166878 A1 | 8/2004 | Erskine et al. |
| 2004/0203748 A1 | 10/2004 | Kappes et al. |
| 2005/0040909 A1 | 2/2005 | Waight et al. |
| 2005/0108374 A1 | 5/2005 | Pierzga |
| 2006/0063485 A1 | 3/2006 | Gainey et al. |
| 2006/0188033 A1 | 8/2006 | Zehavi et al. |
| 2007/0060055 A1 | 3/2007 | Desai et al. |
| 2007/0099667 A1 | 5/2007 | Graham et al. |
| 2007/0285280 A1 | 12/2007 | Robinson et al. |
| 2009/0061870 A1 | 3/2009 | Finkelstein et al. |
| 2009/0098847 A1 | 4/2009 | Noujeim |
| 2009/0174589 A1 | 7/2009 | Moraites |
| 2010/0272012 A1 | 10/2010 | Knefelkamp |
| 2011/0002687 A1 | 1/2011 | Sabat, Jr. et al. |
| 2011/0117870 A1 | 5/2011 | Pera et al. |
| 2012/0235881 A1 | 9/2012 | Pan |
| 2012/0299765 A1 | 11/2012 | Huang et al. |
| 2012/0309288 A1 | 12/2012 | Lu |
| 2012/0322459 A1 | 12/2012 | Jaffri et al. |
| 2013/0099975 A1 | 4/2013 | Cyganski et al. |
| 2013/0244712 A1 | 9/2013 | Kuzio et al. |
| 2013/0316659 A1 | 11/2013 | Ylamurto |
| 2014/0253378 A1 | 9/2014 | Hinman |
| 2014/0269650 A1 | 9/2014 | Sahota |
| 2014/0277854 A1 | 9/2014 | Jones |
| 2015/0133067 A1 | 5/2015 | Chang |
| 2015/0214926 A1 | 7/2015 | Tohidian et al. |
| 2015/0226834 A1 | 8/2015 | Floch |
| 2015/0304783 A1 | 10/2015 | Haubrich et al. |
| 2015/0304869 A1 | 10/2015 | Johnson |
| 2015/0312835 A1 | 10/2015 | Subramanian et al. |
| 2015/0370250 A1 | 12/2015 | Bachrach |

* cited by examiner

METHODS FOR RADIO FREQUENCY SPECTRAL ANALYSIS

CLAIM OF PRIORITY

This application claims the benefit of U.S. Provisional Patent Application No. 62/108,590, filed on Jan. 28, 2015. This application is also a continuation in part application of pending patent application Ser. No. 14/692,808 filed Apr. 22, 2015, which claims the benefit of U.S. Provisional Patent Application No. 62/045,220, filed Sep. 3, 2014, and U.S. Provisional Patent Application No. 62/045,209, filed Sep. 3, 2014, the contents of these applications are herein incorporated by reference.

BACKGROUND OF THE INVENTION

Field of the Invention

This invention generally relates to systems and methods for performing radio frequency spectral analysis. Specifically, an unmanned aerial vehicle is utilized to measure radio signal(s) in real time, and to relay parameters thereof to a processing device over a network for analysis and visualization of the radio signal(s). A radio frequency pre-selector may be utilized to preselect a frequency band for performing the spectral analysis. A plurality of unmanned aerial vehicles may be deployed concurrently in order to obtain an accurate 3D representation.

DESCRIPTION OF THE RELATED ART

Spectral analyzers are hardware devices which measure the magnitude of an input signal versus frequency. The primary use of a spectral analyzer is to measure the power of the spectrum of various signals. By analyzing the spectral of the various signals, the dominant frequency, band, power, distortion, harmonics, bandwidth, and other spectral components of one or more signals can be observed that are not otherwise easily detectable.

The use of spectral analyzers is often employed to measure radio frequency, such as the frequency response, noise, and distortion characteristics, by comparing the input and output spectra of a frequency generating device. In telecommunications such as cellular and radio towers, spectrum analyzers are also used to determine occupied bands, and importantly to track interference sources. For example, cell phone carriers and providers use spectrum analyzers to determine interference sources in GSM and UMTS frequency bands when planning to erect cellular towers or transmitters. In EMC testing, a spectrum analyzer is used for basic pre-compliance testing in order to assess whether a wireless transmitter is working in accordance to federally defined standards for purity of emissions. For instance, output signals at frequencies other than the intended or licensed frequency spectrum would be flagged.

However, current methods employed in the measurement of interference sources and various signal characteristics presents a challenge. Specifically, it would prove difficult to maneuver various radios or receivers for mapping a three dimensional view of signal characteristics with real obstacles. Moreover, it may be burdensome or difficult to maneuver and/or to stabilize RF spectral analyzers in densely populated or crowded areas, such as buildings surrounding cellular towers or repeaters. Moreover, any attempt to manually measure signal characteristics via, for example, a crane, scissor-lift, cherry-picker, or other industrial equipment, would result in the industrial equipment itself providing substantial interference due to the size, weight, and amount of metal in the industrial equipment.

Accordingly, there exists a need in the cellular and wireless communication industry for a system and method that can easily maneuver between cellular tower antennas, power lines, and relay accurate field characteristics and particularly an aerial vehicle based system and method.

SUMMARY OF THE INVENTION

The present invention is generally directed to a system and methods for performing radio frequency spectral analysis. Specifically, the present invention utilizes an unmanned aerial vehicle (UAV) in combination with a spectral analyzer for measuring signal levels from radio frequency (RF) emitting devices, and relay them to a ground station in real time or near real time using either direct radio broadcasts, LTE protocol, or other cellular communication channels, in order to provide a live view of three dimensional field characteristics for visualization by a user. Additionally, the size and weight of a UAV generate little, if any, interference, especially where the UAV selected is less than about 1 meter in diameter and/or weighs less than about 55 pounds.

Accordingly, a system of the present invention generally comprises a UAV and a processing device. The UAV is structured for flight and configured to detect radio signal(s) produced by a signal source, and store various parameters of the radio signal(s) as signal data for processing and/or visualization. The UAV may store the signal data in onboard memory, or may be configured to transmit the signal data over a network to a processing device. The processing device may comprise an application server having a database, which may process the signal data and display the information to at least one user, or multiple users concurrently. As such, the processing device may further be accessible or viewable from a remote device, such as a networked computer or mobile device.

The UAV may comprise a flight body, processor, memory, flight module, a geolocation module, a signal detection module, and a communications module. The flight body may comprise rotary drones or fixed wing drones and appropriate components thereof, such as a hull, a power source, wings and/or at least one actuated propeller. The processor and memory are structured and configured to allow the various modules to function and communicate with one another, and to direct flight controls to components of the flight body.

The flight module is configured to receive programmed flight instructions, either pre-programmed or via wireless communications from a ground station, processing device over a network, or remote control, in order to facilitate the unmanned flight of the UAV. The geolocation module is configured to determine the UAV's present location, and may comprise a GPS, altimeter, accelerometer, and other appropriate components.

The signal detection module is configured to detect radio signal(s) within range of the UAV and store and/or transmit the signal data associated with the radio signal(s). Signal detection module may further comprise a software defined radio and a radio frequency spectrum pre-selector. The communications module is configured to transmit the signal data from the signal detection module, as well as geolocation data from the geolocation module, over a network or directly to a processing device.

Because the onboard UAV signal detection module and communications module are rather limited, due to weight and space constraints, it is therefore desirable to limit detected radio frequencies in order to reduce overhead, power consumption, and save data transmission bandwidth. Therefore, additional embodiments of the present invention are directed to systems and methods for pre-selecting a frequency band for radio frequency spectral analysis.

Accordingly, a system for pre-selecting a frequency band for radio frequency spectral analysis may comprise a signal receiver, a radio frequency pre-selector, an optional second receiver, a software defined radio, and a switch controller.

The signal receiver is structured to receive radio signal(s) as an input signal. The radio frequency pre-selector comprises a signal input module, pre-selector switch, a plurality of filter modules, and a signal output module. Signal input module may comprise at least an input amplifier to boost the gain of the incoming signals. The pre-selector switch connects the signal input module or alternatively, the signal receiver directly, to the plurality of filter modules. The pre-selector switch may be controllable directly by a user through a process device or remote device, or in other embodiments be automatically controllable by a controller.

Each of the plurality of filter modules correspond with a predetermined frequency band in the radio frequency spectrum or other user defined spectrum. Each filter module may comprise at least one filter for passing through desired signal frequencies or a frequency band, while filtering out other frequencies. The output signal module may comprise additional amplifiers and other signal processing circuitry to boost the gain of the desired signal while reducing noise and interference. Shielding may be used on the radio frequency pre-selector or other components described herein to further reduce interference.

The software defined radio (SDR) is structured and configured to detect and receive radio signal(s). In one embodiment, the SDR utilizes the optional second receiver, separate from the receiver connected to the radio frequency pre-selector for listening to or receiving radio signal(s). This allows the SDR to function without interfering with the radio frequency pre-selector. In at least one embodiment, the SDR may, through a switch controller, automatically switch the radio frequency pre-selector to a desired filter module corresponding to a band of a detected signal.

Other embodiments of the present invention are directed to coordinating and/or synchronizing a plurality of UAVs to detect and store radio signal(s) surrounding a signal source simultaneously, in order to provide for a visualization of the three dimensional space and field characteristics of the signal(s) emanating from the signal source. Specifically, a plurality of UAVs, including at least a first and second UAV, are navigated to a start position. A predefined flight pattern is then executed on each of the first and second UAVs. The second UAV's flight pattern may be dynamically calculated and/or determined based on the first UAV's flight pattern. For example, if the first UAV's flight pattern is set to circumnavigate the signal source at a distance of 3 feet, the second UAV's flight pattern may be programmed to dynamically circumnavigate the signal source at a distance of two times the set distance of the first UAV, or 6 feet. Additional UAVs may be added to simultaneously detect and store received signal data surrounding a signal source or proximate to a signal source. The recorded signal data from the plurality of UAVs are then used to create a visualization of space surrounding or proximate to the signal source, and may comprise a Smith Chart or other diagrammatic representation of signal frequency and/or amplitude at various points in Cartesian space.

These and other objects, features and advantages of the present invention will become clearer when the drawings as well as the detailed description are taken into consideration.

BRIEF DESCRIPTION OF THE DRAWINGS

For a fuller understanding of the nature of the present invention, reference should be had to the following detailed description taken in connection with the accompanying drawings in which.

Like reference numerals refer to like parts throughout the several views of the drawings.

DETAILED DESCRIPTION OF THE PREFERRED EMBODIMENT

As shown in the accompanying drawings, the present invention is generally directed to a system and method for performing radio frequency (RF) spectral analysis.

Figure 1:
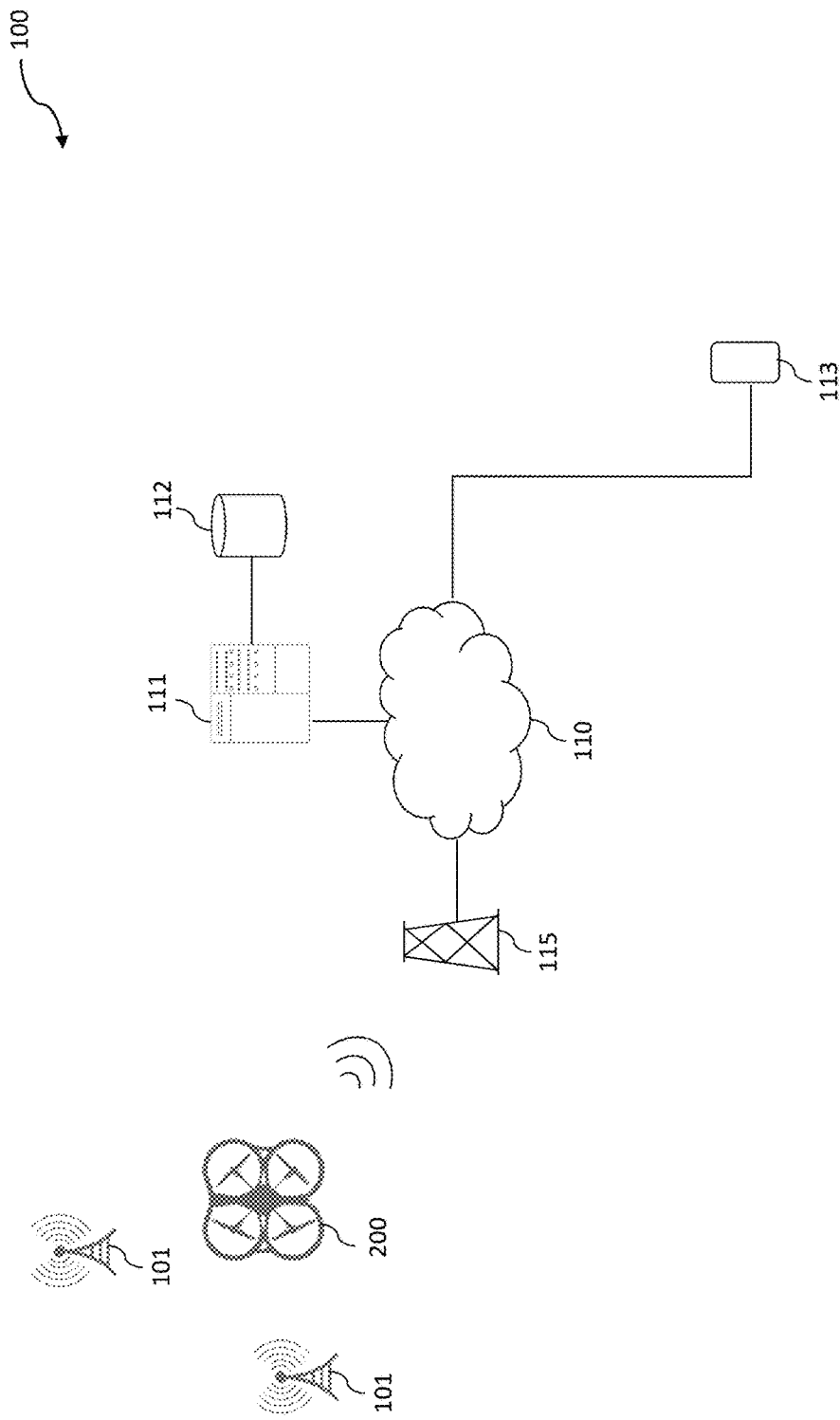
FIG. 1 is a diagrammatic representation illustrating a system for radio frequency spectral analysis.
Figure 2:
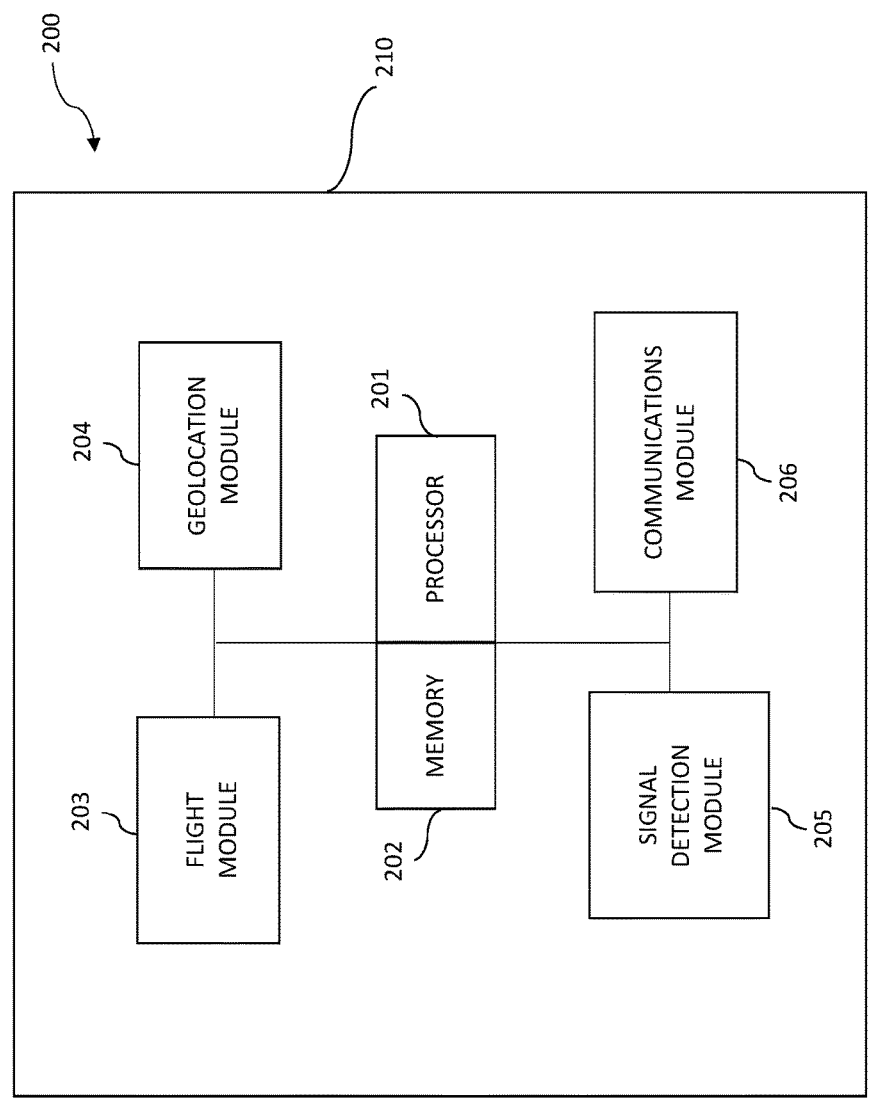
FIG. 2 is schematic representation illustration an unmanned aerial vehicle for radio frequency spectral analysis.

Accordingly, as shown in FIG. 1, a system 100 for RF spectral analysis generally comprises an unmanned aerial vehicle (UAV) 200 structured for flight and configured to detect radio signal(s) (at least one radio signal) produced by a signal source 101 and store various parameters of the radio signal(s) as signal data. In at least one embodiment of the present invention, the UAV 200 may store the signal data in onboard memory. In other embodiments, the UAV 200 may further be configured to transmit the signal data in real time or near real time to a receiver 115 communicably connected to a processing device 111 over a network. The processing device 111 may comprise an application server having a database 112 thereon which may process the received signal data for visualization. In at least one embodiment, the processed data or visualization from the application server 111 may be remote accessible or viewable from a remote device 113.

The signal source(s) 101 emitting radio signal(s) may comprise a radio tower, a cellular tower, antennas, repeaters, amplifiers, or other radio signal emitting structures or devices. The UAV 200 may maneuver to various locations around the signal source(s) or along the path of travel of the various signal(s) in order to determine various characteristics and parameters of the signal(s) in different points of space at different times. For example, the UAV may be positioned between or close to obstacles such as high rises, and between the antenna patterns and towers, in order to detect and map signal characteristics for visualization by a user. In at least some embodiments, the signal characteristics mapped for visualization may comprise either or both the radio signal(s) emitted by the signal source(s) 101 and/or spurious, interfering, or jamming radio signals present in proximity to the signal source(s) 101.

In at least one embodiment, a receiver 115 may merely comprise a ground station or computer structured and configured to receive the signal data from the UAV 200 that is stored thereon, whether by wired or wireless transmission. In a more preferred embodiment, however, the receiver 115 may comprise a cellular transmission tower communicably connected to network 110 via 2G, 3G, 4G, 4G LTE, 5G, WiMAX or long range WiFi, or other mobile or wireless data communication technologies known to those skilled in the art.

Network 110 may accordingly comprise at least the wireless data communication technology or platform described above. Network 110 may further comprise at least two computers in communication with each other, which may form a data network such as via LAN, WAN, Serial, Z-WAVE, ZIGBEE, RS-485, MODBUS, BACNET, the Internet. The additional connections may be facilitated over various wired and/or wireless mediums or any combination thereof including interconnections by routers and/or gateways. Network 110 may comprise additional hardware components and/or devices appropriate for facilitating the transmission and communication between the various systems and devices of the present invention, such as those directed to integrated authentication, quality control or to improve content delivery.

Processing device 111 comprises at least one computer structured and configured to process the signal data from the UAV 200. Accordingly, processing device 111 comprises executable and/or interpretable computer code, or software, that allows for the visualization of the signal data. The software may comprise graphic, mathematic, or analytic software. The software may comprise commercially available software such as RF Studio, RF Explorer, MATLab, Smith Chart creation software. Of course, the software may also comprise proprietary software coded in any number of programming languages known to one skilled in the art, including but not limited to C, C++, C#, Ruby, Java, Dart, Rust, Swift, PHP, Perl, HTML, XHTML, and other equivalent languages and past, present and future variations.

In at least one embodiment, processing device 111 may further comprise an application server, which may comprise general purpose computers, specialized computers, or other hardware components structured and configured to receive, process, transmit, and store information to and from other devices. The hardware component(s) of the application server may comprise additional software components, such as server software for application(s), website(s), various network service(s), and respective databases. The application server is configured with executable and/or interpretable computer code that allows it to perform the methods and processes described within this application, including the processing, analysis, and/or visualization of signal data for user interpretation. The application server may implement the methodology of the used software methods described above, in conjunction with any number of solution stacks that allow the processing, analysis, and/or visualization of signal data to be executed remotely. These solution stacks may include, without limitation, ZEND Server, APACHE Server, NODE.JS, ASP, PHP, Ruby, XAMPP, LAMP, WAMP, MAMP, WISA, and others known to those skilled in the art. In such an embodiment, the application server may also comprise or be communicably connected to a database 112, the database 112 may comprise a SQL database or a text database, and may house the signal data and other associated or appropriate information thereon.

Remote device 113 may comprise a mobile device, a tablet, a computer, a wearable electronic device, or any other device or combination of circuits structured and configured to communicate with another device, computer, or server over the network 110. The remote device 113 may comprise application(s) and user interface(s) that allows a user to interact with the application server described above. The user interface may be proprietary or may comprise a web browser, mobile browser, mobile application, or other application or executable code that allows for communication and visualization of information. In embodiments where the processing device 111 merely comprises a computer, the remote device 113 may be unnecessary as user input and output directed to processing and visualization of signal data may be performed entirely on the computer.

UAV 200, or drone, may comprise at least a flight body 210, and may also comprise various components including processor 201, memory 202, flight module 203, geolocation module 204, signal detection module 205, and communications module 206.

The flight body 210 may comprise various bodies of rotary drones, fixed-wing drones, or other known structures and appropriate configurations appropriate for remote controlled or preprogrammed flight. Flight body 210 may comprise commercially available drones having flight bodies such as or similar to KMel quadrotors, Amazon's octacopter, Parrot AR Drone, AV Puma, and other commercially available drones. Flight body 210 may also comprise proprietary drones created and/or configured with appropriate flight components such as a hull, a power source, wings and/or at least one actuated propeller. The hull may comprise any number of materials appropriate for flight; however, lightweight and durable materials such as carbon fiber may be used in a preferred embodiment. The power source may comprise at least one battery coupled to at least one actuator or motor. In other embodiments, the power source may comprise gas or other fuel powered engines and/or motors. For the present invention, a rotary drone is preferable due to its ability to hover and easily maneuver in any direction, so as to appropriately capture radio signal(s) at various points in space in between various objects.

The processor 201 and memory 202 are structured to allow the various modules to function and communicate with one another. Processor 201 may comprise a general purpose CPU, a microprocessor, a microcontroller, or other combinations of circuits intended for bit-wise operations. Memory 202 may comprise volatile or non-volatile memory, including but not limited to RAM, ROM, flash memory, and other equivalent storage known to those skilled in the art. In at least one embodiment, the various modules on the UAV may share a common processor 201 and/or memory 202 for the various operations and functions described in additional detail below. In other embodiments, the modules recited below may further comprise dedicated processor(s) or memory of their own.

Flight module 203 is configured to receive programmed flight instructions and relay the instructions to the flight body 210, in order to facilitate unmanned flight of the UAV 200. As such, flight module 203 may comprise at least one flight controller communicably connected to a power source and appropriate components of the flight body 210 necessary or desirable for flight, including but not limited to motors, engines, gyroscopes, accelerometers, magnetometers, and appropriate sensors. In a preferred embodiment, the flight controller is configured to transmit a control signal to at least one actuated propeller in order to facilitate the unmanned flight of the UAV 200. The control signal may comprise flight instructions, such as power adjustments and directionality to the actuated propeller(s) or combinations thereof. In at least one embodiment, the flight module 203 and flight controller(s) thereof may be pre-programmed with flight instructions. In a preferred embodiment, the flight module 203 may comprise appropriate wireless receivers or be communicably connected to the same in order to receive the control signal at the flight controller in real time or near real time.

Geolocation module 204 is structured and configured to determine the UAV's present location in a three dimensional Cartesian space. Geolocation module 204 may thus comprise at least one device, such as a GPS, an altimeter, an accelerometer, a magnetometer, a barometer, a gyro, a compass, and/or other components appropriate for measurement of distance and/or determination of locational coordinates. Geolocation data is collected on the geolocation module 204, such as to include GPS coordinates and/or other respective sensor readings. The geolocation data may be stored on embedded memory within the geolocation module and/or on memory 202 as described above.

Signal detection module 205 is configured to detect any radio signal(s) within range of the UAV and store the signal data associated with the radio signal(s). Radio signal(s) may comprise frequencies from 300 GHz to as low as 3 kHz, and may comprise various frequencies and/or bands associated with cellular and/or wireless networks including but not limited to GSM, EDGE, GPRS, LTE, E-TRA, CDMA, WiMAX, HSPA, Flat IP, as well as other wireless or cellular data standards and equivalents known to those skilled in the art. Signal data may comprise in-phase and/or quadrature components of the radio signal(s), including amplitude, frequency, and other appropriate measurements in accordance with various respective analog, digital, and spread spectrum modulation schemes including but not limited to AM, FM, PM, QAM, SM, SSB, ASK, APSK, CPM, FSK, MFSK, MSK, OOK, PPM, PSK, QAM, SC-FDE, TCM, CSS, DSSS, FHSS, THSS, and other equivalents known to those skilled in the art. The signal data may be stored in onboard memory on the UAV, such as at memory 202, or alternatively on embedded memory within the signal detection module 205. In a preferred embodiment, the signal data may be transmitted in real time or near real time to a network via a communications module 206. In such an embodiment, the entirety of the signal data may not need to be stored on onboard UAV memory, and a memory buffer such as a circular buffer may be sufficient.

In a preferred embodiment, signal detection module 205 comprises a software defined radio (SDR) and appropriate hardware components for executing the SDR. The hardware components comprise embedded systems that are capable of performing the equivalent functions of hardware radio components including but not limited to mixers, filters, amplifiers, modulators/demodulators, detectors, convertors, and other appropriate components. SDR may include the use of an embedded general purpose or specialized computer or microcontroller, receiver(s), transmitter(s), antenna(s). SDR may comprise commercially available SDRs, SDR receivers, prebuilt SDRs, or SDR receiver kits mounted onto the UAV 200, such as SDRstick, ADAT, Apache Labs, SunSDR, Myriad-RF, FLEX, USRP, SoftRock, and others known to those skilled in the art.

Communications module 206 is structured and configured to transmit the signal data from the signal detection module over a network, such as network 110 described above. Accordingly, communications module 206 may comprise transceivers, antennas, and hardware logic appropriate for the transmission of the signal data. In at least one embodiment, communications module 206 may also transmit geolocation data from the geolocation module 204, such as GPS coordinates, altitude, compass readings, and also noted above sensor readings.

Accordingly, some embodiments the present invention are therefore drawn to systems for radio frequency spectral analysis that comprise at least one embodiment of the UAV 200 as described above, in combination with a processing device, such as processing device 111 of FIG. 1. The processing device 111 is configured to process the signal data stored on the UAV 200. In at least one embodiment, the processing device 111 may be configured to receive the signal data over the network such as network 110. The signal data may be received from the UAV 200, such as through its communication module 206, in real time or near real time. In a preferred embodiment, the processing device 111 will process the signal data for visualization of the radio signal(s) and/or signal data in three dimensional space. In order to facilitate this, sets of signal data are taken and are tied to geolocation data such as GPS coordinates described above. For example, for each point in Cartesian space where the UAV 200 took a sample of radio signal(s), a set of signal data may be stored on the UAV 200 and/or transmitted to the processing device 111 and stored on a database thereon 112. Each entry of signal data may be associated with or corresponding to a set of Cartesian coordinates or a point in space. In another preferred embodiment, the visualization of the signal data associated with various points in space may also be viewable by a user in four dimensions, i.e. over a period of time.

Figure 3:
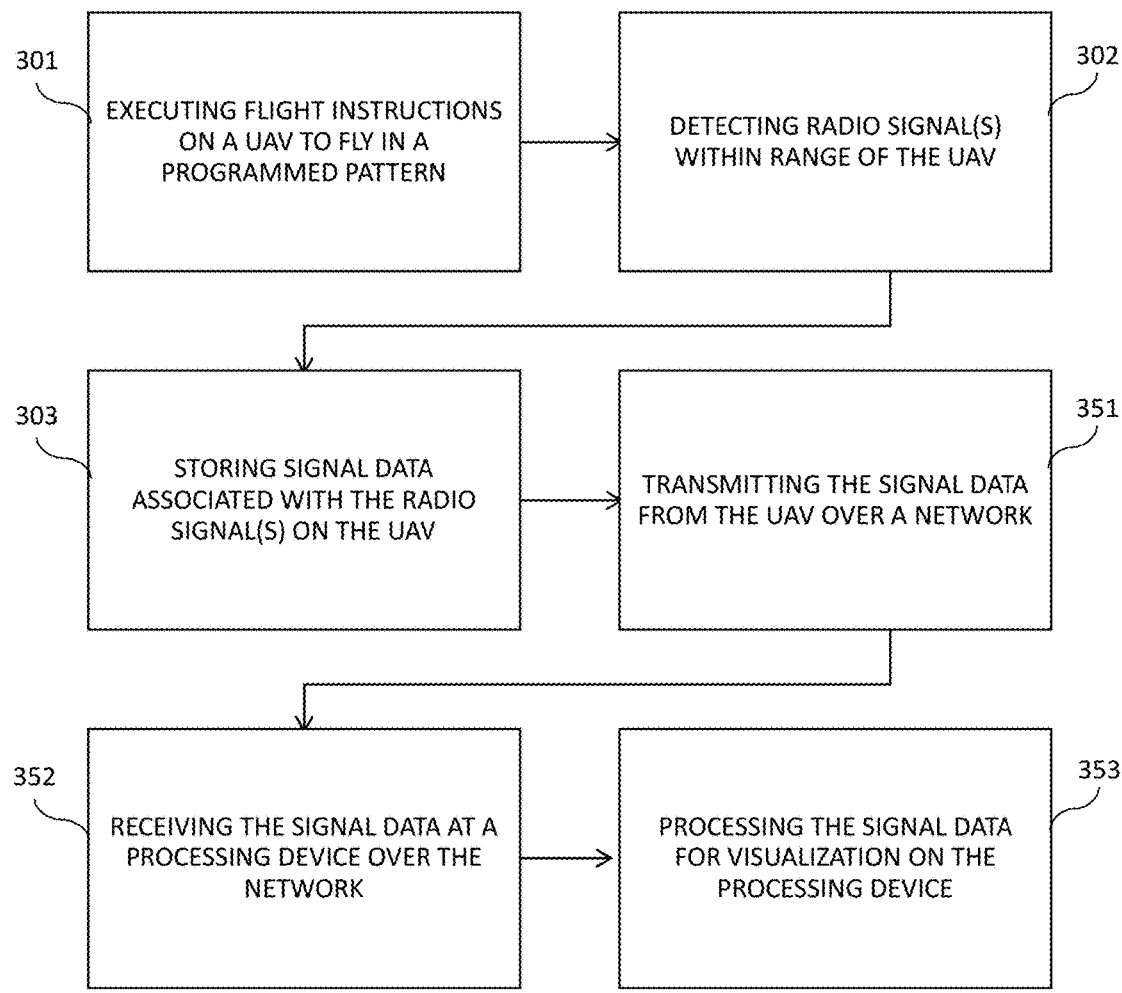
FIG. 3 is a flowchart of a method for radio frequency spectral analysis, where the signal data is transmitted and processed over a network.

Additional embodiments of the present invention are drawn to methods for radio frequency spectral analysis. According, and drawing attention to FIG. 3, one method for radio frequency spectral analysis may comprise first executing flight instructions on a UAV, as in 301, to fly in a programmed pattern. The flight instructions may be pre-programmed onto a flight controller of the UAV, or may be received wirelessly or remotely in real time or near real time. The flight instructions may be based on conditional logic of the sensors of the UAV, such as the signal detect module. For example, the UAV may be programmed to automatically seek and/or track a pre-programmed signal pattern. In some embodiments, the UAV may be programmed to trace the path of a traveling signal and adjust flight instructions accordingly to follow the path, while compensating and rerouting the flight path to avoid any physical obstacles based on onboard or received sensor readings.

Next, radio signal(s) are detected within range of the UAV, as in 302. Radio signals may comprise signals of various frequencies and/or bands associated with cellular and/or wireless networks described above. The signal data associated with the radio signal(s) are stored on the UAV, as in 303. Signal data may comprise in-phase and/or quadrature components of any signals detected, including amplitude, frequency, and other appropriate measurements or metrics.

The signal data is transmitted from the UAV over a network, as in 351. The network may comprise the Internet in a preferred embodiment, but may also comprise any other LAN, WAN, wireless or partially wired networks. The signal data is received at a processing device over the network, as in 352. In a preferred embodiment, the processing device comprises an application server structured to process the signal data for visualization. Of course, the processing device may merely comprise a general purpose or specialized computer for processing the signal data, which may be received via a physical or local wireless connection such as USB, WiFi, Bluetooth or other NFC, or other data connection methods.

The signal data is processed for visualization on the processing device, as in 353. Commercially available or proprietary software as described above may be utilized for processing the signal data for visualization. The signal data may accordingly be visualized by a user in three dimensional space. Raw data may also be displayed in accordance with various points in space. In at least one embodiment, the user may be able to view raw data and/or the visualization of the signal in space over time.

Figure 4:
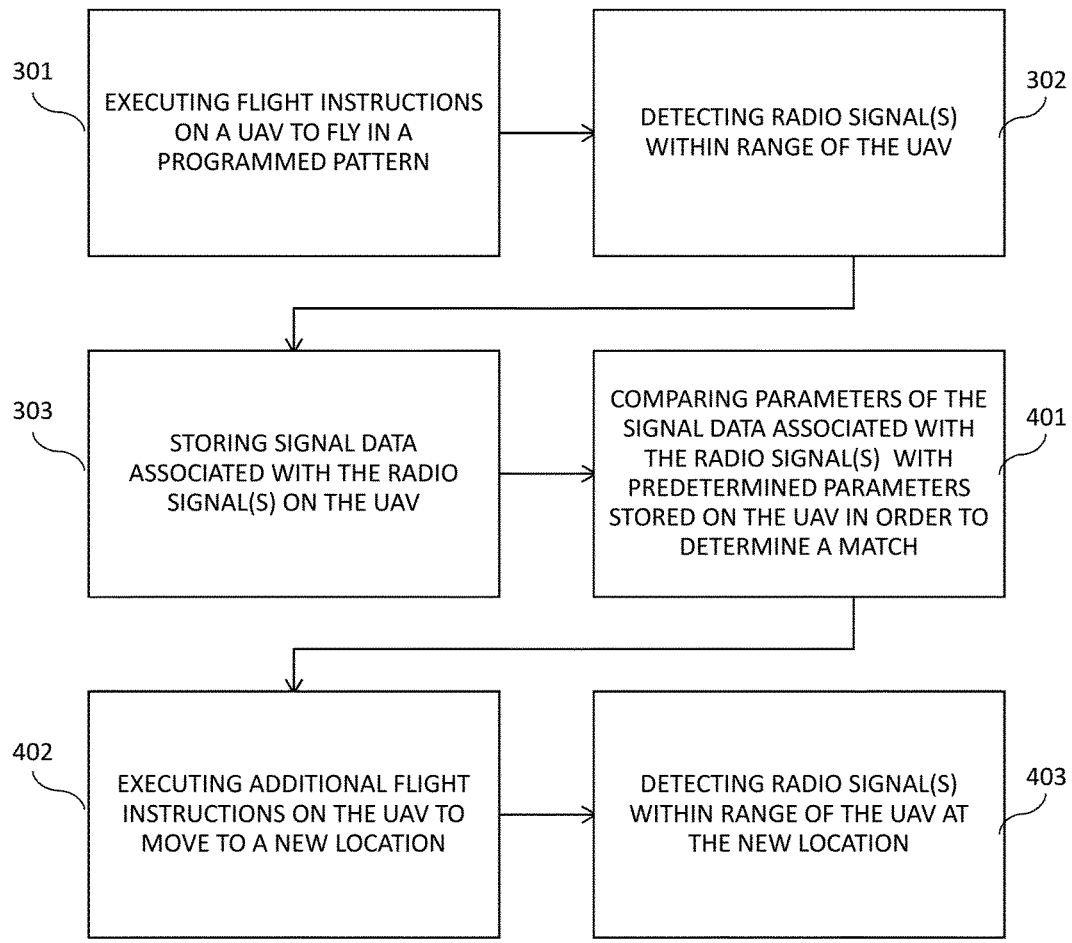
FIG. 4 is a flowchart of another method for radio frequency spectral analysis, where the unmanned aerial vehicle is programmed to search for predetermined parameters in radio signal(s).

FIG. 4 illustrates another method of the present invention including steps 301 to 303 as described above. In addition, the method illustrated further comprises comparing parameters of the signal data associated with the radio signal(s) with predetermined parameters stored on the UAV in order to determine a match, as in 401. As described above, this step involves the use of conditional logic based on readings received from the sensors on the UAV such as through the signal detection module and/or geolocation module. For example, the UAV may be programmed to automatically seek and/or track a pre-programmed signal pattern. If no match is found, the UAV may continue on a preprogrammed path or a pseudo-random path of flight to search for the pre-programmed signal pattern.

Next, additional flight instructions are executed on the UAV, as in 402, to move to a new location. The UAV may then detect radio signal(s) within range of the UAV at the new location, as in 403. After detection at the new location, the parameters may be compared again to determine a match, as in 401. The steps of 401 to 403 may be repeated until the radio signals having the predetermined parameters are found.

Figure 5:
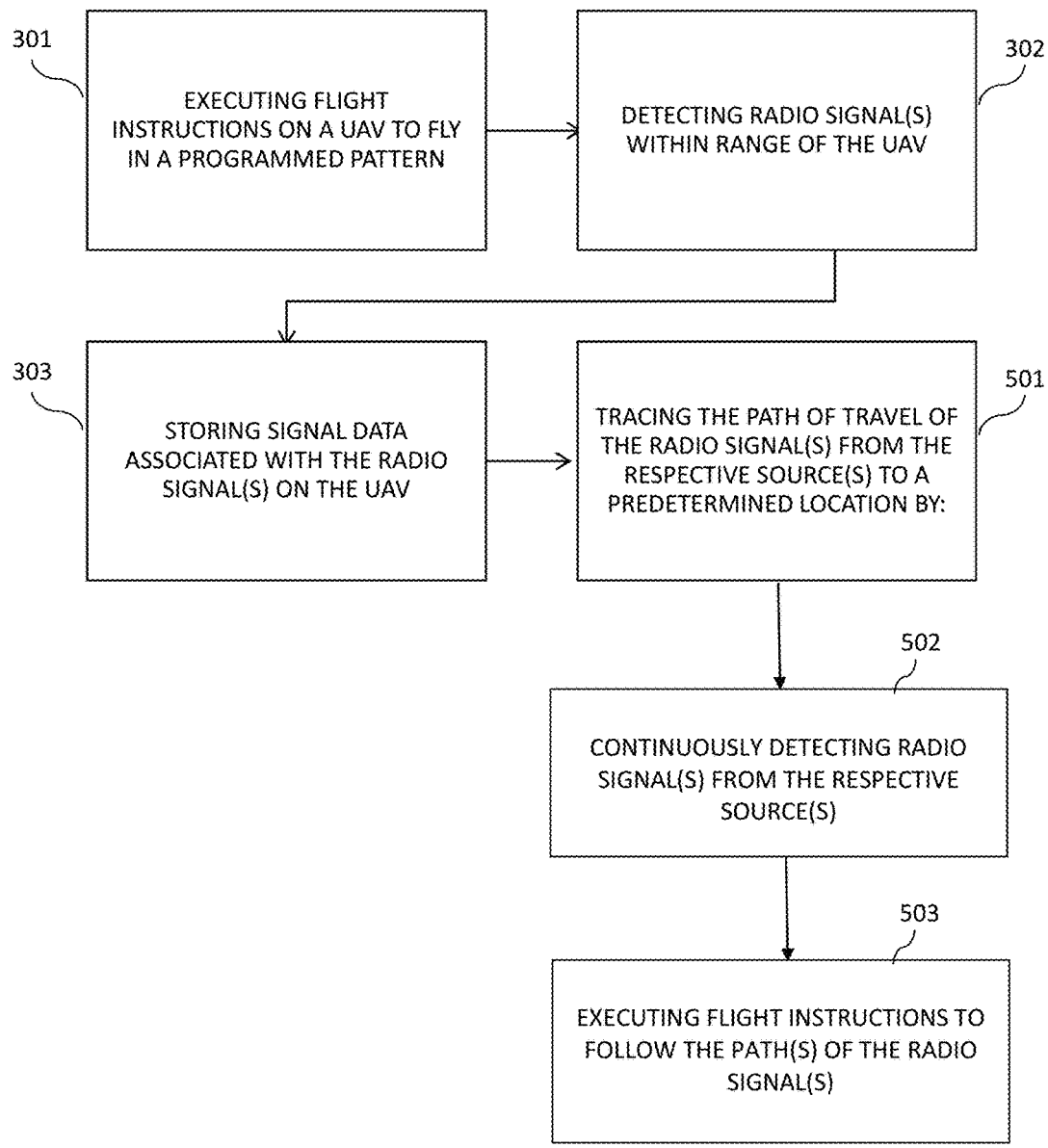
FIG. 5 is a flowchart of another method for radio frequency spectral analysis, where the unmanned aerial vehicle is programmed to follow and map the radio signal(s).

FIG. 5 illustrates another method of the present invention including steps 301 to 303 as described above. In addition, the path of travel of the radio signal(s) may be traced, as in 501, from the respective source(s) to a predetermined location. This tracing may be performed by the UAV by continuously detecting radio signal(s) from the respective source(s), as in 502. In accordance with the detection of the radio signal(s), the UAV may execute flight instructions to follow the path(s) of the radio signal(s) as in 503. The UAV may further be pre-programmed to avoid any physical obstacles based on onboard or received sensor readings during the tracing process. In some embodiments, the steps of FIG. 4 steps 401 to 403 may be combined with the steps of 501 to 503, such as to first search out for a radio signal source having a particular parameters, then following the path of the signal source. For example, a unique cellular signal such as one associated with a cellular device may be first sought out, then the UAV may be pre-programmed to follow the cellular device such as to keep the matched signal within range.

Figure 6:
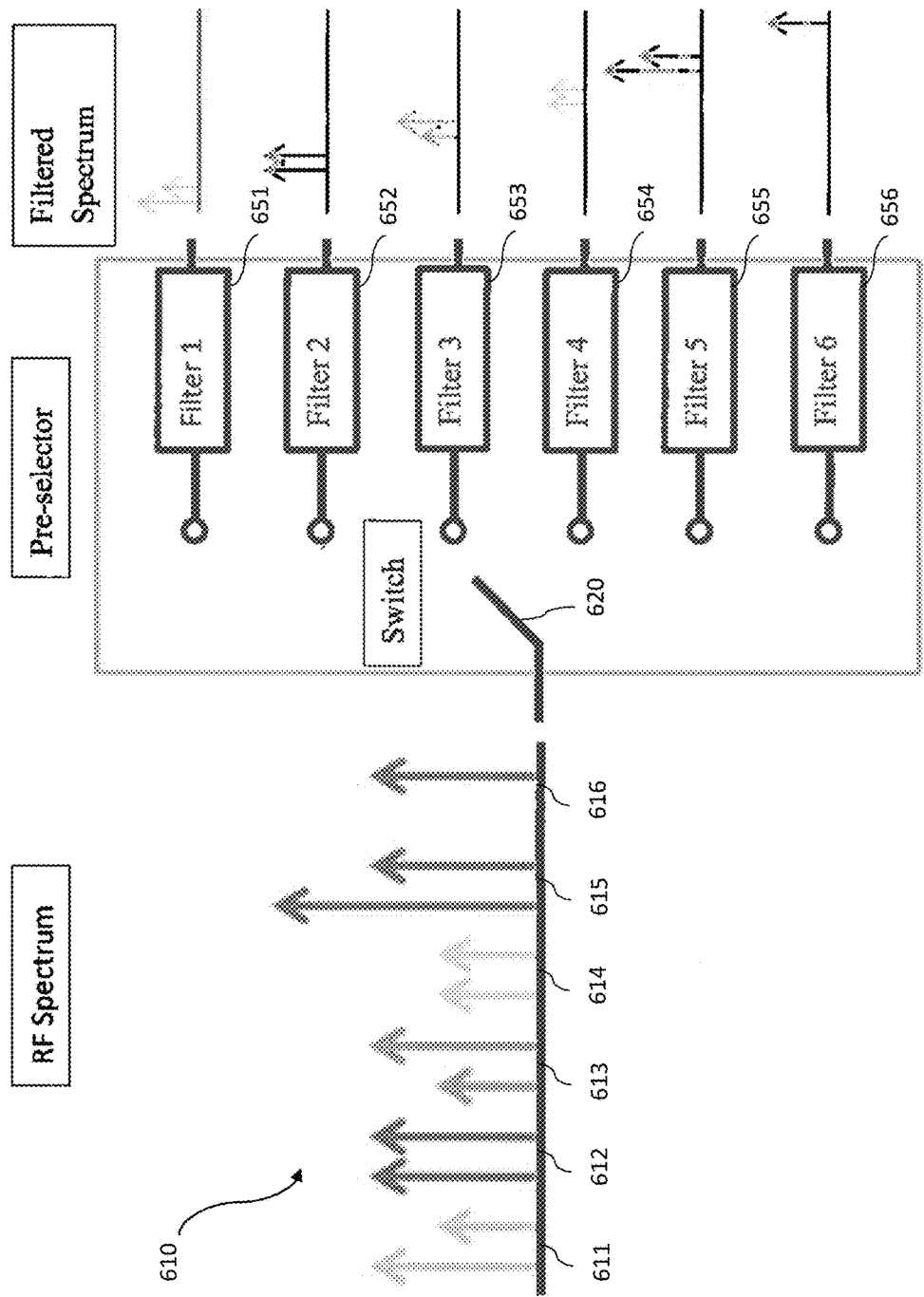
FIG. 6 is a diagrammatic representation illustrating the functionality of a radio frequency pre-selector.

In order to facilitate the efficient and effective detection of particular radio frequency signal(s), a frequency pre-selector such as shown in FIG. 6 may be utilized in additional embodiments of the present invention. Because of the limited processing capacities of the UAV's onboard software defined radios (SDRs), effective processing can be enhanced by limiting the input spectrum of the radio frequency signal(s). In other words, processing overhead may be avoided. Additionally, because cellular uplink bands have no filters, the ability the preselect a specific band will filter out all extraneous frequencies and signals, thus reducing artifacts, in addition to improving dynamic range. Accordingly, a plurality of frequencies 610, such as 611-616 of the radio frequency spectrum may be keyed to specific filters such as 651 to 656 selectable by a switch 620. Upon selecting the desired filter 651 to 656, the plurality of radio frequencies 610, or input spectrum will be selectively filtered such as to output only the desired frequency, frequency range or frequency band.

Figure 7:
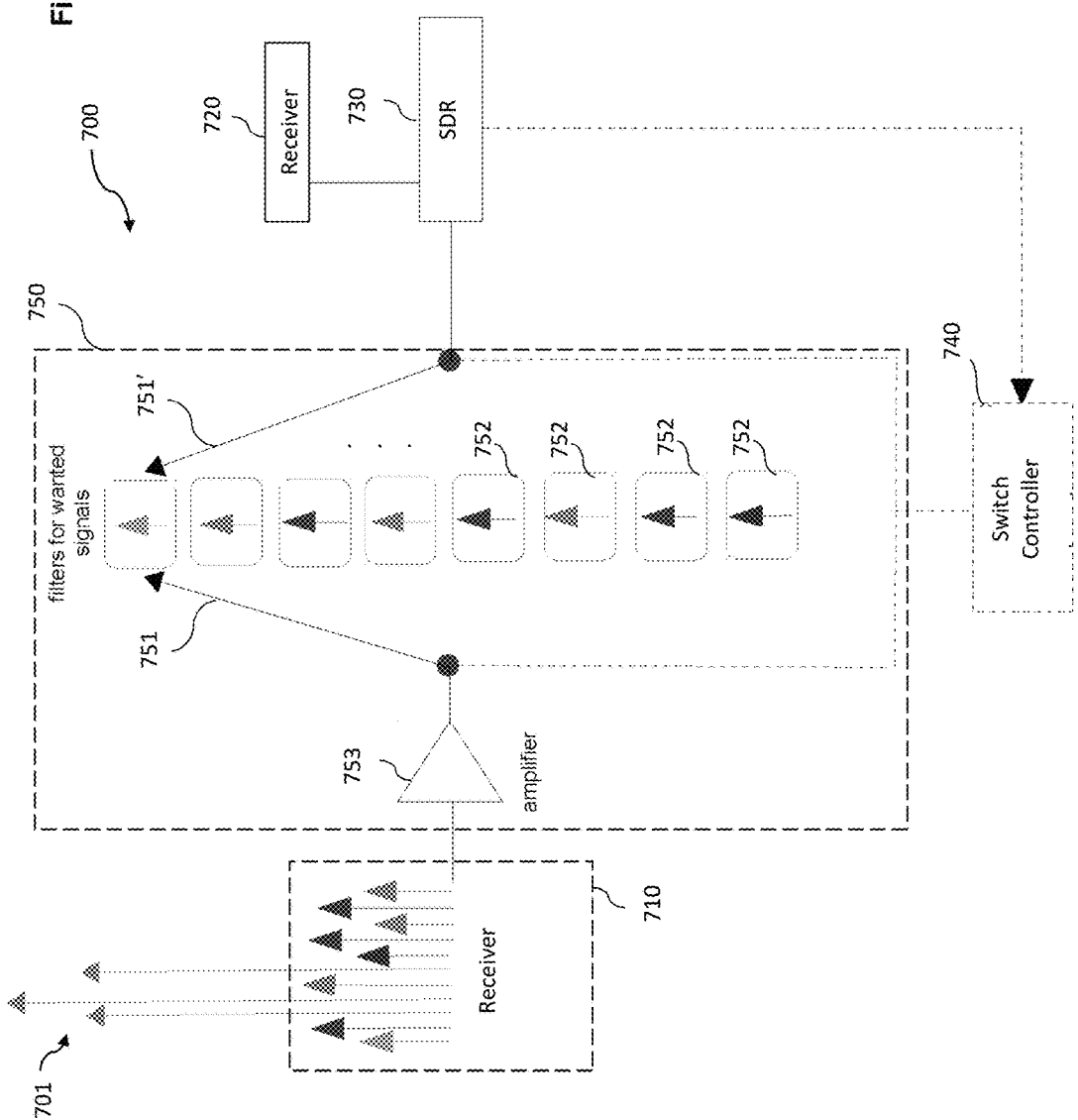
FIG. 7 is a schematic representation illustrating a system for pre-selecting a frequency band for radio frequency spectral analysis.
Figure 8:
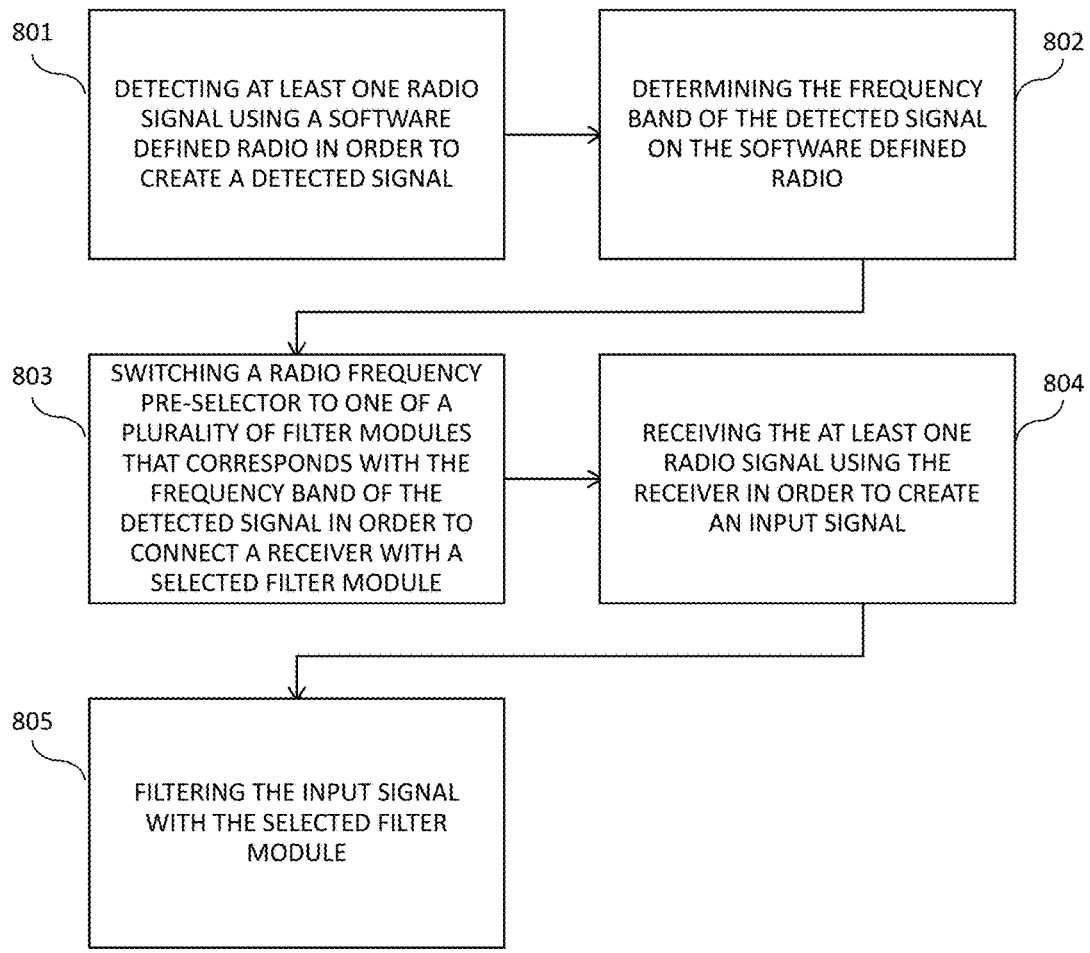
FIG. 8 is a flow chart of a method for pre-selecting a frequency band for radio frequency spectral analysis.

FIG. 7 illustrates a schematic representation of a system 700 for pre-selecting a frequency band for radio frequency spectral analysis. Accordingly, system 700 may comprise a first receiver or signal receiver 710, a radio frequency pre-selector 750, a second or separate receiver 720, a software defined radio (SDR) 730, a switch controller 740.

The signal receiver 710 is structured to receive radio signal(s) as denoted by radio signal(s) 701. Accordingly, signal receiver 710 may comprise an antenna and appropriate circuitry for detecting radio signal(s) 701 and processing or converting the same into usable form, i.e. as an input signal to be transmitted to the radio frequency pre-selector 750. Signal receiver 710 may comprise any number of radio receivers known to those skilled in the art. Signal receiver 710 may also comprise transceivers structured and configured to not only receive radio signal(s) but to also transmit radio signal(s).

The radio frequency pre-selector 750 may comprise a signal input module not shown, a pre-selector switch 751, 751', a plurality of filter modules 752, and a signal output module not shown. In at least one embodiment, the radio frequency pre-selector 750 may further comprise an interference shielding formed in enclosing relations to the radio frequency pre-selector and its components and modules. Separate or additional input shield and output shield may be structured to increase isolation of the radio frequency pre-selector from undesirable signal(s) or interference at the input and output locations.

Signal input module is communicably connected to the signal receiver 710 for receiving an input signal. Signal input module may merely comprise an input amplifier 753. Input amplifier 753 may comprise a low noise amplifier in at least one embodiment in order to compensate for signal losses. Input amplifier 753 may also comprise high gains, low gains, or adjustable gains. In at least one embodiment, the pre-selector may also comprise a signal output module not shown, which may similarly comprise at least one output amplifier which may be the same or similar to input amplifier 753. An output amplifier may be implemented in addition to, or in place of, the input amplifier 753.

The pre-selector switch 751, 751' may comprise an input portion 751 and output portion 751'. The pre-selector switch 751, 751' is controllable and is communicably connected to the signal receiver 710 to one of a plurality of filter modules 752. The pre-selector switch 751, 751' may be controllable via a wired or wireless connection through a processing device, such as a computer, an applications server, or remote device 113 discussed in detail above. In other embodiments, the pre-selector switch 751, 751' may also be controllable via a software defined radio (SDR) which will be described in additional detail below.

The filter modules 752 each comprise at least one filter structured to pass through a predefined frequency band while filtering out other frequency bands. Accordingly, at least one filter may comprise low-pass filters, high-pass filters, band-pass filters, band-stop filters, notch filters, comb filters, and other appropriate filters known to those skilled in the art. In a preferred embodiment, at least one surface acoustic wave filters may be used. In other embodiments, a plurality of surface acoustic wave filters may be used, such as three sequential surface acoustic wave filters of the same band.

The software defined radio (SDR) 730 may include embedded computer, chip, or microcontroller equivalents of radio components including but not limited to mixers, filters, amplifiers, modulators/demodulators, and other components as described above, such as at signal detection module 205. The SDR may comprise a switch controller 740 for controlling the pre-selector switch 751, 751' of the radio frequency pre-selector 750. Switch controller 740 may comprise a microcontroller or any combination of circuits for processing input instructions and an output control signal. In a preferred embodiment, the switch controller 740 is configured to automatically switch the pre-selector switch 751, 751' to one of the plurality of filter modules 752 that correspond to the downlink band of a detected radio signal. In at least one embodiment, the SDR comprises and/or utilizes a separate receiver, such as receiver 720, for detecting frequency band of a radio signal, in order to reduce interference to the radio frequency pre-selector 750.

At least one other embodiment of the present invention is further directed to a method for pre-selecting a frequency band for radio frequency spectral analysis. Accordingly, radio signal(s) is/are detected using a software defined radio, as in 801, in order to create a detected signal. The software defined radio may comprise an internal receiver, or may detect a signal via a connected receiver such as a second or separate receiver 720 described above.

Next, the frequency band of the detected signal is determined, as in 802, on the software defined radio. In at least one embodiment, the software defined radio is in communications with a radio frequency pre-selector. Based on the frequency band of the detected signal, the radio frequency pre-selector is switched, as in 803, to one of a plurality of filter modules that corresponds with the frequency band of the detected signal in order to connect a receiver with a selected filter module. The receiver in this step may comprise a first receiver or signal receiver such as 710 described above. In at least one embodiment, the radio frequency pre-selector performs the switching automatically to a filter module that corresponds with the frequency band of a detected signal. The filter module may comprise a plurality of surface acoustic wave filters of the same band, such as three sequential surface acoustic wave filters of the same band as described above.

The radio signal(s) is/are also received at the receiver, in order to create an input signal as in 804. The input signal is subsequently filtered with the selected filter module, as in 805. In at least one embodiment, the radio signal is detected using a first receiver on a software defined radio or in connection with a first receiver, while the radio frequency pre-selector is connected to a second receiver for receiving the radio signal(s) separately, which produces the input signal to be filtered. Such an embodiment allows the SDR to listen while it transmits using separate processes and components so that there is no or reduced interference. The detection of the SDR may be limited and customized, such as by additionally and expressly filtering out unwanted bands. The SDR may also comprise a high speed switch to more effectively switch to a matching system, and may comprise additional low or high power amplifiers to compensate for losses due to the filters.

Figure 9:
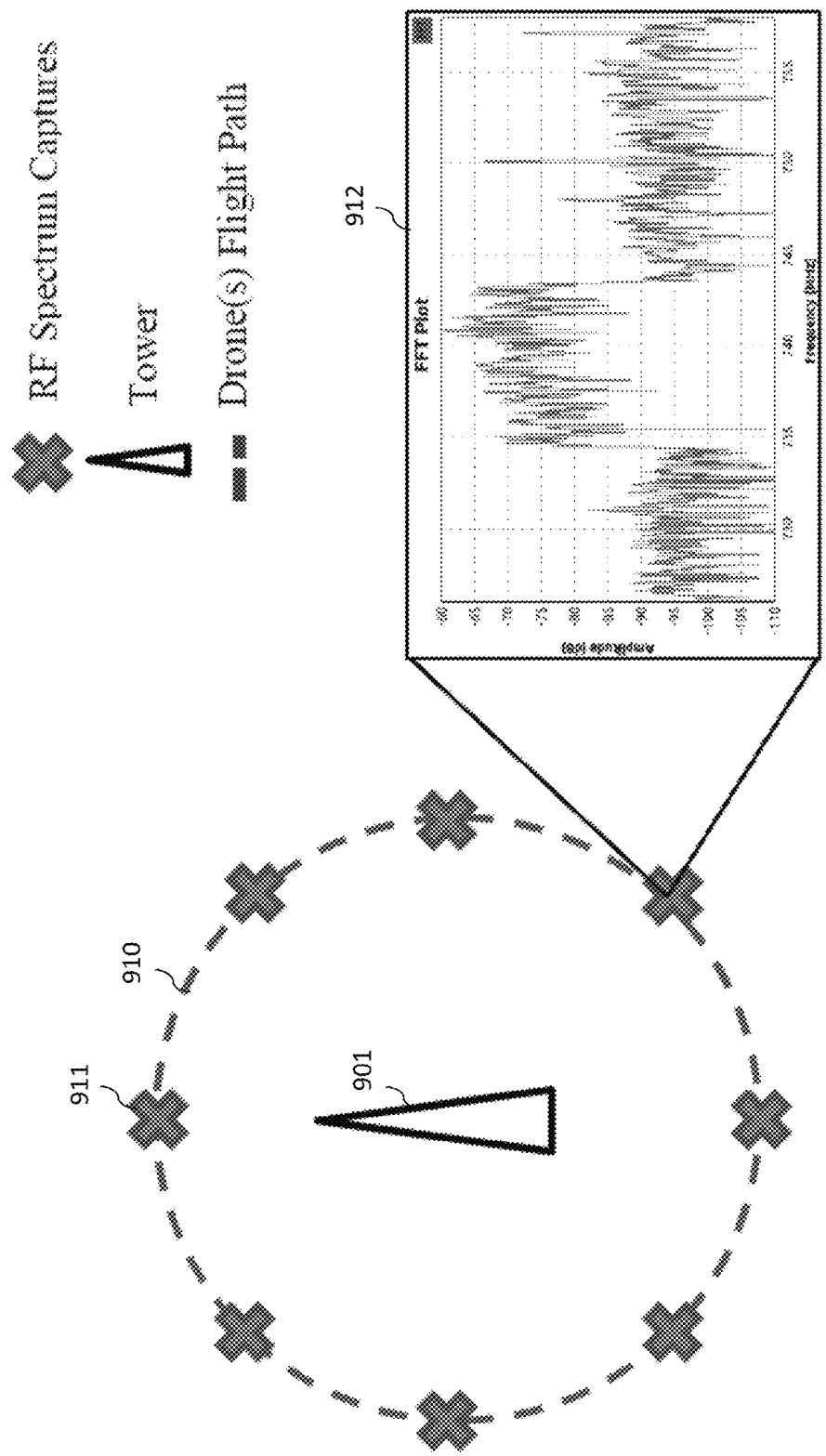
FIG. 9 is a diagrammatic representation illustrating one example of a UAV's flight path and points of signal data captures relative to a signal source.
Figure 10:
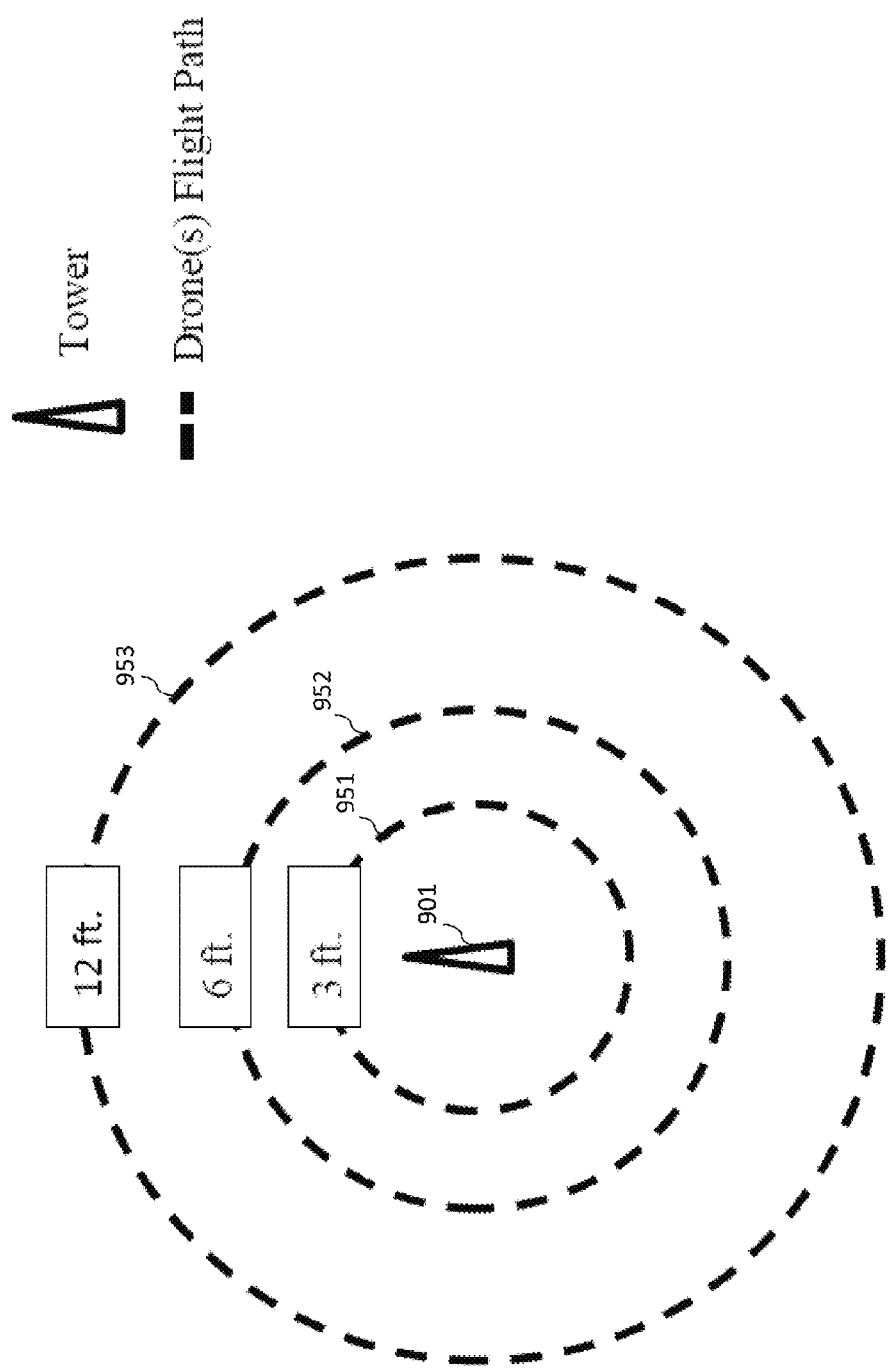
FIG. 10 is a diagrammatic representation illustrating another example of a plurality of UAVs' flight paths relative to a signal source.

Other embodiments of the present invention are directed to methods for using multiple UAVs concurrently in order to provide a three dimensional visualization or representation of field radio signal(s) and characteristics. For example, it may be desirable to measure the field characteristics of a signal source such as a cellular tower radially from various points in space. Accordingly, and as illustrated in FIG. 9, a signal source 901 may comprise a radio or cellular tower, and a drone or UAV is configured to traverse a flight path circumferentially around the signal source 901 in order to capture signal data of radio signal(s) emanating from the signal source 901. The resulting amplitude and frequency of the radio signal(s) may then be plotted for two-dimensional or three-dimensional visualization, and may further be visualized over time. As illustrated in FIG. 10, a plurality of drones or UAVs may be deployed concurrently in order to map a larger field, map a field in higher resolution, i.e. by using more field capture points, or both.

Figure 11:
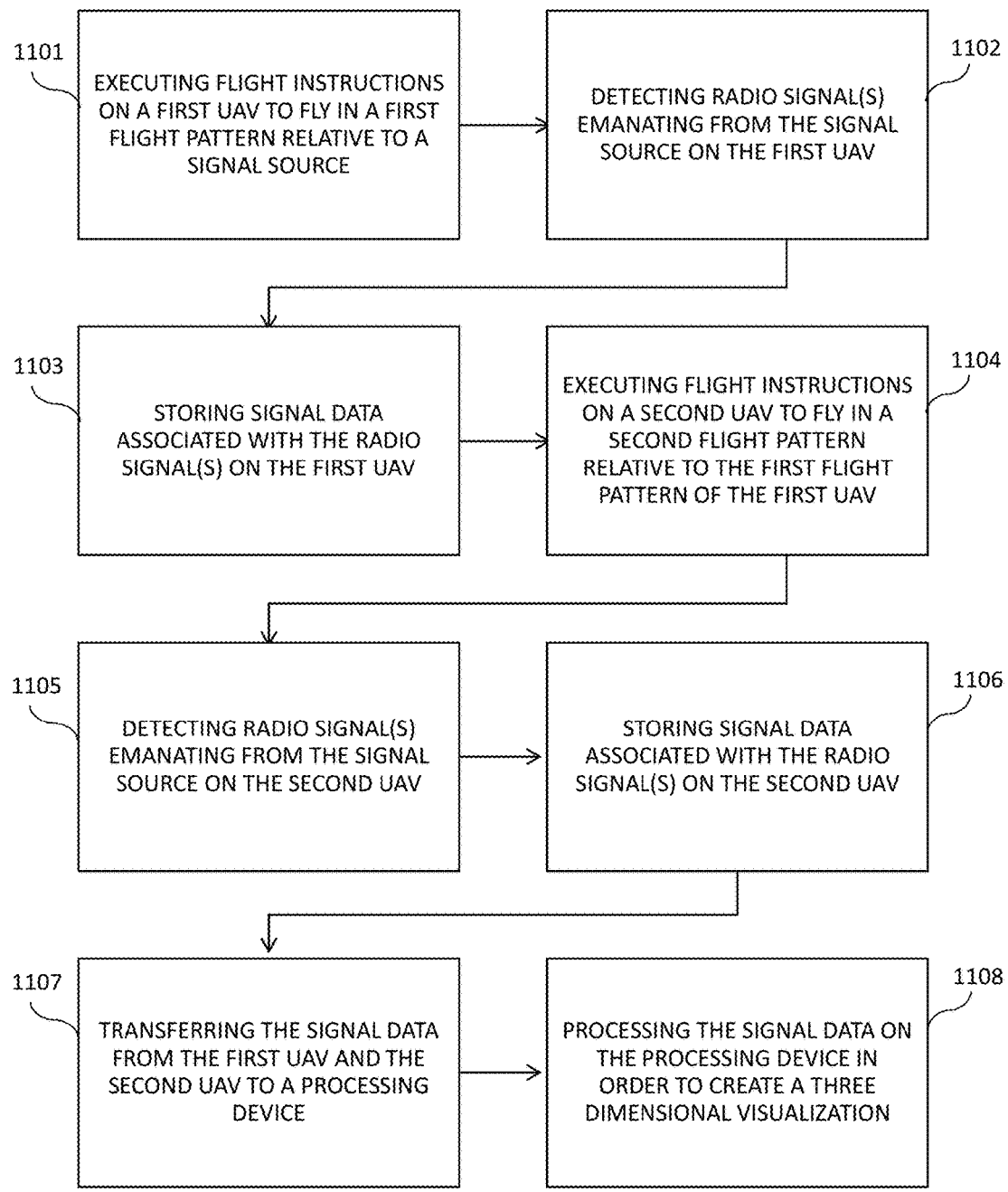
FIG. 11 is a flow chart of a method for using multiple drones concurrently to provide a field visualization of detected radio signal(s).

As illustrated in FIG. 11, a method for radio frequency spectral analysis may comprise executing flight instructions on a first UAV, as in 1101, to fly in a first flight pattern relative to a signal source. The first flight pattern may comprise circumnavigating the signal source at a first range. The first range is equivalent to the distance between the first UAV and the signal source as it circumnavigates the signal source. In other words, the first UAV may be programmed to fly circumferentially around the signal source at a predetermined distance or first range that may be set or modified on the first UAV through its flight module 203 and/or processor 201. In at least one embodiment, a first range of 1 feet to 10 feet may be used. The first UAV may be configured through its flight module to automatically or partially automatically adjust its flight trajectory to maintain the relative first range or distance between the first UAV and the signal source.

Radio signals emanating from the signal source are detected, as in 1102, on the first UAV. This may be performed via the UAV's signal detection module 205 as described above. Desired frequency bands may be captured, including but not limited to LTE, GSM, PCS, AWS, and IMT. The signal data may comprise GPS location, altitude, time, the particular drone that captured the data such as an identifier or serial number, and other appropriate or desirable information for visualizing a RF spectrum signal data set in three dimensional space.

The signal data associated with the radio signal(s) are stored on the first UAV, as in 1103. This signal data may be stored in onboard memory on the UAV, such as at memory 202, within embedded memory of the signal detection module 205, as described above. In another embodiment, the signal data may be transmitted in real time or near real time to a network via the communications module 206.

Flight instructions are similarly executed on a second UAV to fly in a second flight pattern relative to the first flight pattern of the first UAV, as in 1104. In at least one embodiment, the flight instructions on the second UAV are automatically executed, upon execution of flight instructions on the first UAV. This may be performed through an external processing unit, or by way of communication between the first UAV and the second UAV through each UAV's respective processor 201, memory 202, and communications module 206 as described above. The second flight pattern may comprise circumnavigating the signal source at a second range. In a preferred embodiment, the second range is two times the first range. For example, if the first range is a distance of 3 feet from the signal source, then the second range is preferably 6 feet away from the signal source. In other embodiments, a multiplier of 1.1 to 3 times may be used, depending on the desired resolution of the signal data set.

The radio signals emanating from the signal source are detected, as in 1105, on the second UAV. Signal data associated with the radio signal(s) are stored on the second UAV, as in 1106. In a preferred embodiment of the present invention, the flight instructions on the second UAV is executed concurrently, such that the first UAV and the second UAV each detect and store radio signal(s) simultaneously while flying in accordance to each UAV's respective flight pattern.

The signal data from both the first UAV and the second UAV are transferred to a processing device, as in 1107. The signal data is processed on the processing device, as in 1108, in order to create a three dimensional visualization. The processing device may comprise a general purpose computer or other machine as described above, a networked computer or server structured and configured to process the signal data for visualization, i.e. having at least a processor and memory, as well as software configured for mapping the signal data set. In at least one embodiment of the present invention, a three dimensional visualization may be produced in the form of a Smith Chart.

Figure 12:
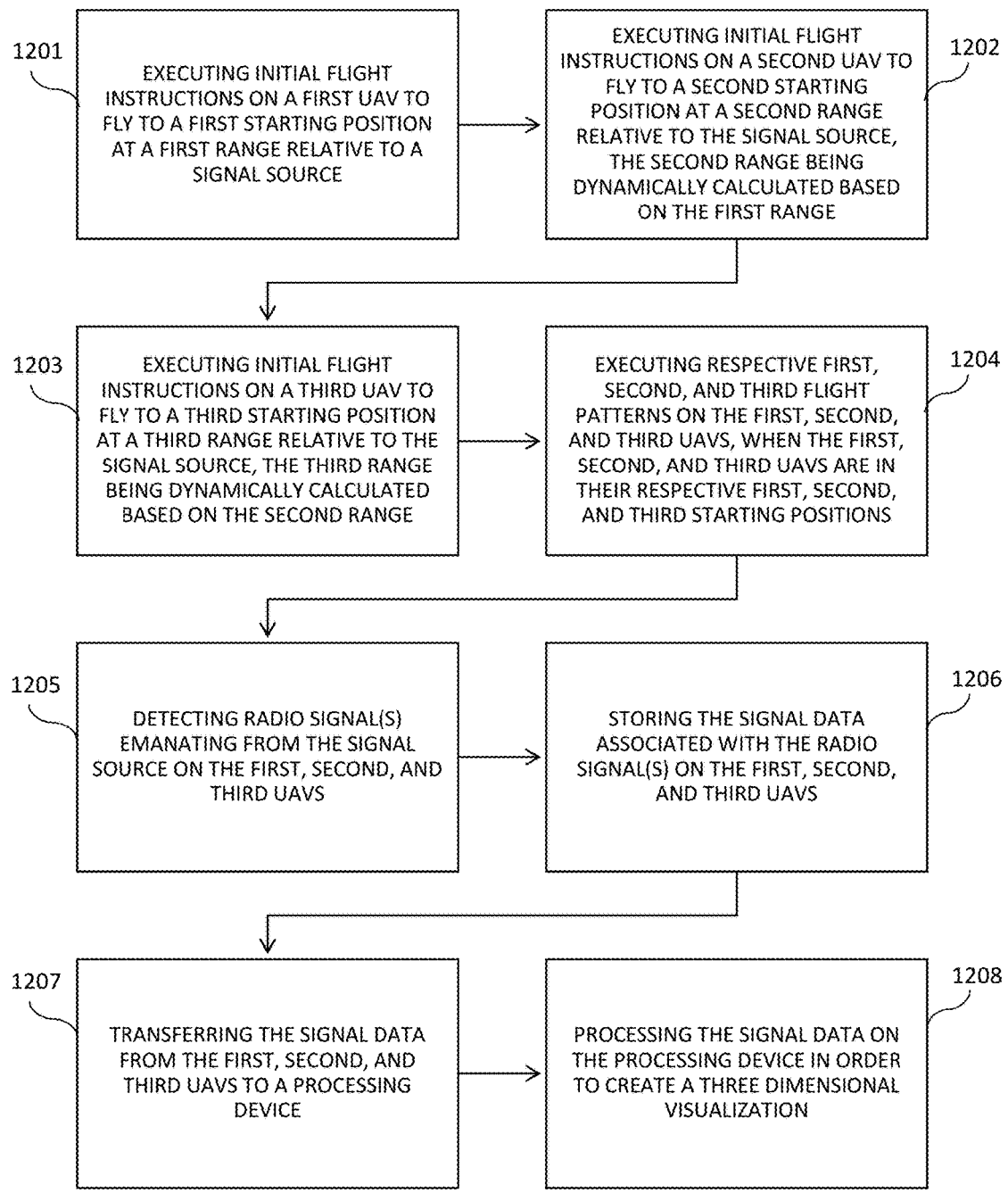
FIG. 12 is a flow chart of another method for using multiple drones concurrently to provide a field visualization of detected radio signals.

As illustrated in FIG. 12, another method for radio frequency spectral analysis may comprise executing initial flight instructions on a first UAV to fly to a first starting position at a first range relative to a signal source, as in 1201. The first starting position may be predetermined and inputted via x, y, and z coordinates on the Cartesian plane, via input of GPS coordinates and altitude, or via proximity sensors on the UAV relative to the target. The first range may be preprogrammed into directly or inputted into the UAV remotely.

Initial flight instructions are also executed on a second UAV to fly to a second starting position at a second range relative to the signal source, the second range being dynamically calculated based on the first range, as in 1202. In at least one embodiment, the second range is dynamically calculated to be two times the first range. This may be performed by wireless communication between the first UAV and the second UAV as described above. For example, after receiving the first range on the first UAV either by direct programmable input or by remote input, the first UAV may then communicate to the second UAV the first range, and the second UAV may be configured to automatically calculate the second range based on onboard programmable logic. In another embodiment, the first UAV may calculate the second range for the second UAV. In yet another embodiment, an external processing device, ground station, or remote device as describe above may communicate the first range to the first UAV and the second range to the second UAV, based on a user's input of the first range.

Initial flight instructions may further be executed on a third UAV to fly to a third starting position at a third range relative to the signal source, the third range being dynamically calculated based on the second range, as in 1203. This process may occur similar to the determination of the second range as described above. That is, the third range may be determined by the first and/or second range(s) from the first and/or second UAV(s), or may be directly calculated and processed by an external processing device.

Respective first, second, and third (if applicable) flight instructions may be executed, as in 1204, on the first, second, and third UAVs, when the first, second, and third UAVs are in their respective first, second, and third starting positions. This allows the first, second, and third, or plurality of UAVs to synchronize flight and radio frequency signal capture. Accordingly, each of the first, second, and third (or plurality of UAVs) may emit a "ready" signal upon arriving in position. Alternatively, an external processing device may record real-time or near real-time GPS coordinates from each of the respective UAVs as they move in position, and may be programmed to initiate the flight sequence on each of the UAVs simultaneously when all UAVs are in their respective starting positions.

The radio signal(s) are detected, as in 1205, on each of the first, second, and third UAVs. This process may occur for each of the respective first, second, and third UAVs as described above. Signal detection may be simultaneous with flight, or the UAV may be configured to stop and hover at select points or at a certain time interval in order to detect the radio frequency signal(s) from a fixed point. The signal data associated with the radio signal(s) are stored, as in 1206, on the first, second, and third UAVs. This process is explained above, whereby the signal data may be stored on internal memory or may be transmitted to an external device over a wireless networks, or both.

The signal data on each of the first, second, and third UAVs may then be transferred to a processing device, as in 1207. The signal data is processed on the processing device in order to create a three dimension visualization, as in 1208. A Smith Chart, or other 3D or 2D visualization may be created based on the datasets detected and stored on the UAVs.

In other embodiments, four or more UAVs may be utilized in order to increase the range of the radio frequency signal capture and/or to increase the resolution of the captured field, i.e. more capture points and data sets for mapping a higher resolution visualization field.

Any of the above methods may be completed in sequential order in at least one embodiment, though they may be completed in any other order. In at least one embodiment, the above methods may be exclusively performed, but in other embodiments, one or more steps of the methods as described may be skipped.

Since many modifications, variations and changes in detail can be made to the described preferred embodiment of the invention, it is intended that all matters in the foregoing description and shown in the accompanying drawings be interpreted as illustrative and not in a limiting sense. Thus, the scope of the invention should be determined by the appended claims and their legal equivalents.

What is claimed is:

1. A method for radio frequency spectral analysis comprising:
   providing at least a first UAV and a second UAV, the first UAV and second UAV each including at least a flight module and signal detection module, each flight module including at least a plurality of filters,
   utilizing the flight module to execute flight instructions on the first UAV to fly in a first flight pattern relative to a signal source, utilizing the signal detection module on the first UAV to detect radio signal(s) emanating from the signal source, utilizing the flight module to execute flight instructions on a second UAV to fly in a second flight pattern relative to the first flight pattern of the first UAV, utilizing the signal detection module on the second UAV to detect radio signal(s) emanating from the signal source, selecting at least one of the plurality of filters of the signal detection module in order to selectively filter the detected radio signal(s), the selected filter at least partially corresponding to a downlink band of the detected radio signal(s).

2. The method as recited in claim 1 wherein the flight instructions on the second UAV is executed concurrently, such that the first UAV and the second UAV each detect and store radio signal(s) simultaneously while flying in accordance to each UAV's respective flight pattern.

3. The method as recited in claim 1 further comprising automatically executing flight instructions on the second UAV, upon execution of flight instructions on the first UAV.

4. The method as recited in claim 1 wherein the first flight pattern comprises circumnavigating the signal source at a first range.

5. The method as recited in claim 4 wherein the second flight pattern comprises circumnavigating the signal source at a second range.

6. The method as recited in claim 5 wherein the second range is two times the first range.

7. The method as recited in claim 6 further comprising calculating, automatically on a processing unit, the second range of the second flight pattern to be two times the first range of the first flight pattern.

8. The method as recited in claim 7 further comprising:
providing at least a third UAV, the third UAV including at least a flight module and signal detection module
utilizing the flight module to execute flight instructions on the third UAV to fly in a third flight pattern relative to the second flight pattern of the second UAV,
utilizing the signal detection module on the third UAV to detect radio signal(s) emanating from the signal source.

9. The method as recited in claim 8 wherein the third flight pattern comprises circumnavigating the signal source at a third range.

10. The method as recited in claim 9 further comprising calculating, automatically on a processing unit, the third range of the third flight pattern to be two times the second range of the second flight pattern.

11. The method as recited in claim 1 further comprising:
transmitting the signal data from the first UAV and the second UAV over a network,
receiving the signal data at a processing device over the network,
processing the signal data for visualization on the processing device.

12. The method as recited in claim 11 wherein the transmitting, receiving, and processing steps occur in real time concurrently with the radio signal(s) detection during the UAV flight.

13. The method as recited in claim 1 wherein the signal data comprises GPS coordinates, altitude, time, signal amplitude and frequency.

14. The method as recited in claim 13 further comprising:
transferring the signal data from the first UAV and the second UAV to a processing device,
processing the signal data on the processing device in order to create a three dimensional visualization.

15. A method for radio frequency spectral analysis comprising:
providing at least a first UAV and a second UAV, the first UAV and second UAV each including at least a flight module and signal detection module,
utilizing the flight module to execute initial flight instructions on a first UAV to fly in a first flight pattern relative to a signal source,
utilizing the flight module to execute initial flight instructions on a second UAV to fly in a second flight pattern relative to the signal source, at least the second flight pattern being at least partially determined based on the first flight pattern.

16. The method as recited in claim 15 wherein the second flight pattern being at last partially determined based on the first flight pattern comprises calculating a range of the second UAV with reference to a range of the first UAV.

17. The method as recited in claim 16 wherein calculating the range of the second UAV is accomplished via onboard programmable logic of the second UAV.

18. The method as recited in claim 17 wherein the range of the second UAV is two times the range of the first UAV.

19. The method as recited in claim 18 further comprising a third UAV, wherein the range of the third UAV is two times the range of the second UAV.

20. The method as recited in claim 19 further comprising coordinating flight instructions between the first UAV and the second UAV through a respective processor and communication module on each of the first and second UAV.

* * * * *